United States Patent
Wen

(10) Patent No.: US 10,002,766 B1
(45) Date of Patent: Jun. 19, 2018

(54) HIGH PRESSURE LOW THERMAL BUDGE HIGH-K POST ANNEALING PROCESS

(71) Applicant: Shanghai Huali Microelectronics Corporation, Shanghai (CN)

(72) Inventor: Zhenping Wen, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days. days.

(21) Appl. No.: 15/429,191

(22) Filed: Feb. 10, 2017

(30) Foreign Application Priority Data

Dec. 16, 2016 (CN) .......................... 2016 1 1167792

(51) Int. Cl.
| | |
|---|---|
| *H01L 21/3205* | (2006.01) |
| *H01L 21/28* | (2006.01) |
| *H01L 21/02* | (2006.01) |
| *H01L 29/51* | (2006.01) |
| *H01L 29/66* | (2006.01) |

(52) U.S. Cl.
CPC .. *H01L 21/28185* (2013.01); *H01L 21/02181* (2013.01); *H01L 29/517* (2013.01); *H01L 29/66545* (2013.01)

(58) Field of Classification Search
CPC ......... H01L 21/28185; H01L 21/28202; H01L 21/02255; H01L 21/76828
See application file for complete search history.

(56) References Cited

U.S. PATENT DOCUMENTS

2012/0280370 A1* 11/2012 Chudzik ........... H01L 21/02181
257/632
2017/0092491 A1* 3/2017 Chen ................. H01L 21/02247

* cited by examiner

*Primary Examiner* — Selim Ahmed
*Assistant Examiner* — Evan Clinton
(74) *Attorney, Agent, or Firm* — Kilpatrick Townsend & Stockton LLP

(57) ABSTRACT

A method of fabricating high-k/metal gate semiconductor device by incorporating an enhanced annealing process is provided. The enhanced annealing process in accordance with the disclosure can be operated at relatively low temperature and high pressure and thus can improve the k value and repair the above-mentioned deficiencies of the HK layer. Under the enhanced annealing process in accordance with the disclosure, H+ can be diffused from the ammonia gas and to repair the broken bonds because of high pressure, while avoiding adversely impact the NiSi and implanted ions in the HK layer due to the low temperature. The enhanced annealing process in accordance with the disclosure can be performed between 300° C. to 500° C. at a pressure of 15-20 atm for 15 to 50 minutes in some embodiments.

8 Claims, 3 Drawing Sheets

HIGH PRESSURE LOW THERMAL BUDGE HIGH-K POST ANNEALING PROCESS

BACKGROUND OF THE INVENTION

The present invention is directed to semiconductor processes and devices.

Since the early days when Dr. Jack Kilby at Texas Instrument invented the integrated circuit, scientists and engineers have made numerous inventions and improvements on semiconductor devices and processes. The last five decades or so have seen a significant reduction in semiconductor sizes, which translate to ever increasing processing speed and decreasing power consumption. And so far, the development of semiconductor has generally followed Moore's Law, which roughly states that the number of transistors in a dense integrated circuit doubles approximately every two years. Now, semiconductor processes are pushing toward below 20 nm, where some companies are now working on 14 nm processes. Just to provide a reference, a silicon atom is about 0.2 nm, which means the distance between two discrete components manufactured by a 20 nm process is just about a hundred silicon atoms.

Manufacturing semiconductor devices has thus become more and more challenging and pushing toward the boundary of what physically possible. Huali Microelectronic Corporation™ is one of the leading semiconductor fabrication companies that has focused on the research and development of semiconductor devices and processes.

When fabricating transistors with typical gate dimensions below 50 nm, the so-called "high-k/metal gate" (HKMG) technology has become popular. According to the HKMG manufacturing process flow, an insulating layer included in the gate electrode is comprised of a high-k material. This is in contrast to the conventional oxide/polysilicon (poly/SiON) method, whereby the gate electrode insulating layer is typically comprised of an oxide, preferably silicon dioxide or silicon oxynitride in the case of silicon-based devices. A typical HKMG stack structure can contain a silicon oxide based interfacial layer (IL), a high-k (HK) dielectric, followed by a metal gate electrode. Hf-based dielectrics, HfO2 in particular, are the most widely used high-k dielectrics in current CMOS technology and are usually deposited on top of an IL, whose primary role is to provide good electrical quality of the interface with Si. A sub-nm chemical oxide (SiOx) or oxynitride (SiON) layer is typically employed as IL.

Currently, two different approaches exist for implementing HKMG in the semiconductor fabrication process flow. In the first approach, called gate-first, the fabrication process flow is similar to that followed during the traditional poly/SiON method. Formation of the gate electrode, including the high-k dielectric film and the work function metal film, is initially performed, followed by the subsequent stages of transistor fabrication, e.g., definition of source and drain regions, silicidation of portions of the substrate surface, metallization, etc. On the other hand, according to the second scheme, also known as gate-last or replacement gate, fabrication stages such as dopant ion implantation, source and drain region formation and substrate silicidation are performed in the presence of a sacrificial dummy gate. The dummy gate is replaced by the real gate after the high-temperature source/drain formation and all silicide annealing cycles have been carried out.

Figure 1:
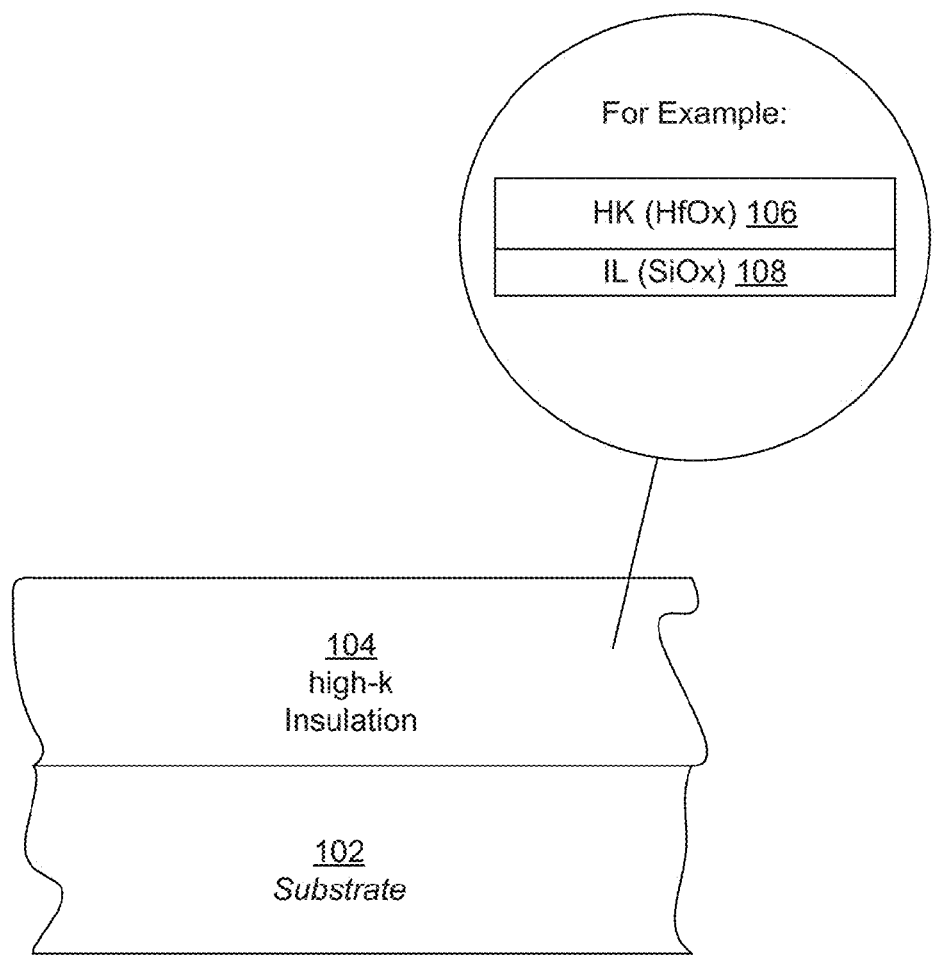
FIG. 1, illustrates the fabrication process incorporating the enhanced annealing process in accordance with the disclosure can begin with forming a high-k insulation layer on top of a substrate.

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

The present disclosure relates to fabrication of high-k/metal gate (HKMG) stacks for semiconductors, in particular to reducing diffusion of O2 into the IL after the HKMG stack is formed.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification (including any accompanying claims, abstract, and drawings), may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. Section 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Because the high-K gate dielectric layer (the HK layer) comprises mostly metal ion oxides (e.g. HfO2) without fixed atomic coordinates, the HK layer tends to have ruptures with broken bonds. This can affect stability of the HK layer, which in turn can affect the value of k. Typically, reliability of high-k gate stacks can be improved using dopant activation anneal at high temperatures around 1000° C. This can be accomplished by a nitrided oxide process involving ammonia to penetrate the gate oxide at temperatures in excess of 1000° C. Ammonia anneal is a popular post high-k annealing process as N ions in the ammonia gas (NH3) can be diffused into the HK layer under the high temperature to repair the broken bonds or missing bonds such that the structure of the HK layer can be improved as a Hf—O—N structure. In this way, the ammonia annealing makes the HfO2 in the HK layer more stable and also increases the k value.

However, once the high temperature reaction has begun, it is difficult to control the concentration of the nitrogen incorporated into the HK layer. During the high temperature annealing process, high temperature can adversely impact NiSi and implanted ions in the HK layer. This is due to the high temperature can cause the NiSi low resistance to change to NiSi high resistance. Such an effect can in turn cause the contact resistance to increase. Moreover, the high temperature can also cause the implanted ions to diffuse and thus leakage currents.

The present disclosure addresses and solves the current problem of high temperature anneal mentioned above. One aspect of the present disclosure is a method of fabricating high-k/metal gate semiconductor device by incorporating an enhanced annealing process. The enhanced annealing process in accordance with the disclosure can be operated at relatively low temperature and high pressure and thus can improve the k value and repair the above-mentioned deficiencies of the HK layer. Under the enhanced annealing process in accordance with the disclosure, H+ can be diffused from the ammonia gas and to repair the broken bonds because of high pressure, while avoiding adversely impact the NiSi and implanted ions in the HK layer due to the low temperature. The enhanced annealing process in accordance with the disclosure thus can produce excellent electrical device performance, mechanical stability and high reliability.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method comprising: forming a high-k/metal gate stack by forming an insulation layer on a substrate and performing a relatively (as compared to the existing technology) high-pressure and low temperature annealing process to improve the insulation layer. In one embodiment, the insulation layer can include high-k dielectric materials such as HfO2.

Figure 2:
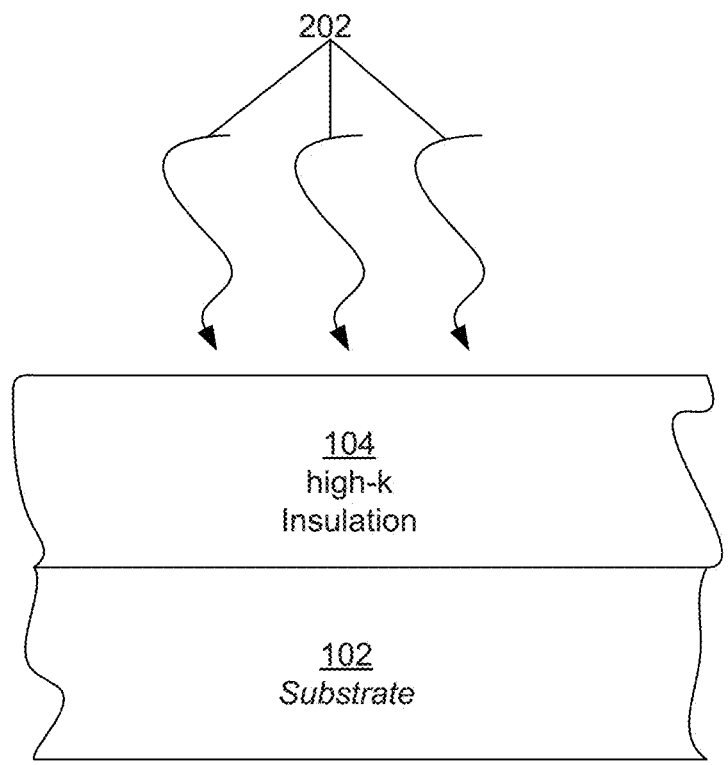
FIG. 2 illustrates an example of the enhanced annealing process incorporated in the fabrication process
Figure 3:
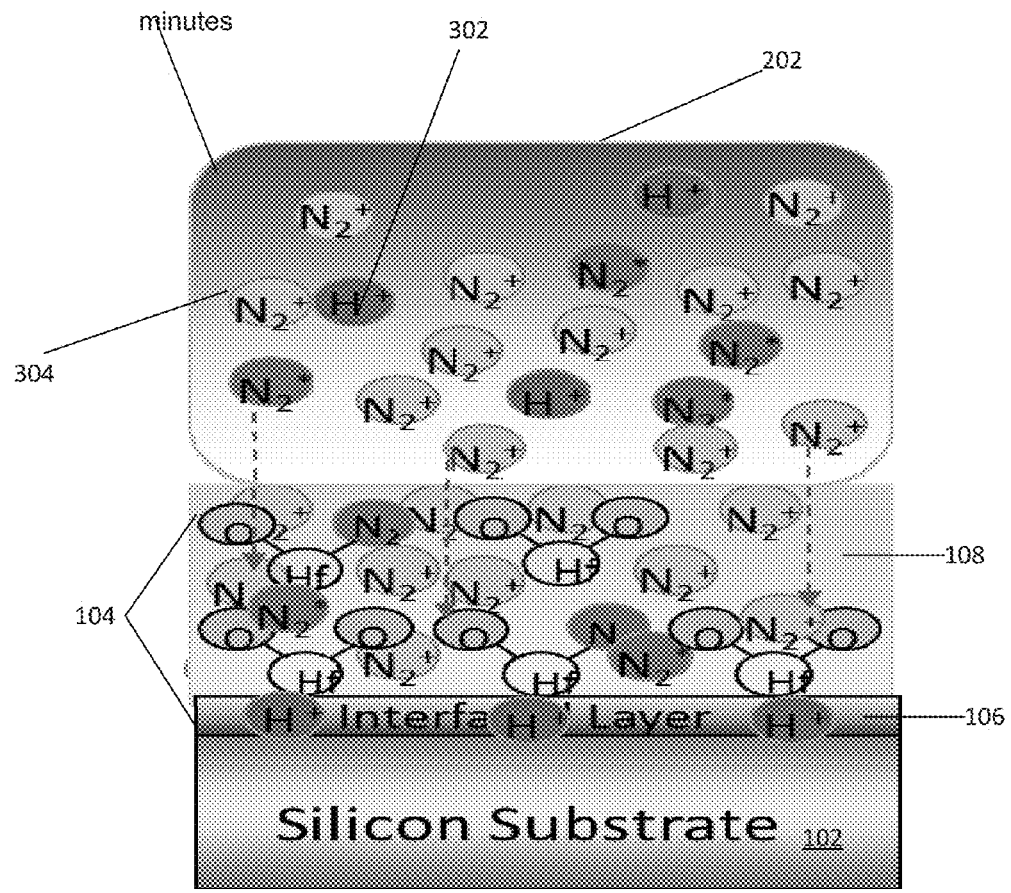
FIG. 3 shows an effect of H+ diffusion due to the relatively high pressure of the annealing process in accordance with the disclosure.

FIGS. 1-3 illustrate some aspects of a process for fabricating a capacitor having an ultra-thin capacitor dielectric layer incorporating the enhanced annealing process in accordance with the disclosure. The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Turning now to FIG. 1, illustrates the fabrication process incorporating the enhanced annealing process in accordance with the disclosure can begin with forming a high-k insulation layer 104 on top of a substrate 102. The substrate 102 can be, for example, a silicon material as typically used in the semiconductor industry, e.g., relatively pure silicon as well as silicon admixed with other elements such as germanium, carbon, and the like. Alternatively, the semiconductor material can be germanium, gallium arsenide, or the like. The semiconductor material may be provided as a bulk semiconductor substrate, or it could be provided on a silicon-on-insulator (SOI) substrate, which includes a support substrate, an insulator layer on the support substrate, and a layer of silicon material on the insulator layer. Furthermore, the substrate 102 may be a semiconductor on insulator (SOI). In some examples, the substrate 102 may include a doped epitaxial (epi) layer. In other examples, the substrate 102 may include a multilayer compound semiconductor structure.

In various embodiments, the substrate 102 may include various doped regions depending on design requirements (e.g., p-type wells or n-type wells). The doped regions may be doped with p-type dopants, such as boron or BF2, and/or n-type dopants, such as phosphorus or arsenic. The doped regions may be formed directly on the substrate 102, in a P-well structure, in an N-well structure, in a dual-well structure, or using a raised structure. The semiconductor substrate 110 may further include various active regions, such as regions configured for an N-type metal-oxide-semiconductor transistor device (referred to as an NMOS) and regions configured for a P-type metal-oxide-semiconductor transistor device (referred to as a PMOS). For example, substrate 102 may have dopant regions and epitaxial layers formed to define source and drain regions.

As shown, an insulation layer 104 can be formed on top of the substrate 102. Layer 104 may comprise silicon oxide, silicon oxynitride, silicon nitride, in-situ steam glass (ISSG), spin-on glass (SOG), fluorinated silica glass (FSG), carbon doped silicon oxide, BLACK DIAMOND® (from Applied Materials of Santa Clara, Calif.), Xerogel, Aerogel, amorphous fluorinated carbon, Parlyene, BCB (bis-benzocyclobutenes), SILK™ (from Dow Chemical, Midland, Mich.), polyimide, other suitable dielectric materials, or combinations thereof. In some embodiments, layer 104 can comprise high-k materials such as HfOx. In those embodiments, for growing the high-k materials in layer 104, a rapid thermal oxidation process through a furnace can be used. The thickness range for layer 104 can be between 0.8 and 2.0 nm or any other range as desired. Layer 104 can be characterized as "ultra-thin" in some embodiments, but this is not necessarily the only case.

In some examples, as shown in an expanded view of layer 104 in FIG. 1, layer 104 can comprise an SiOx layer or an interfacial layer (IL) 108 on top of an upper surface of the substrate 102 and an HK layer 106 on top of the IL 108. The IL 108 may comprise materials such as silicon nitride or other suitable material, for example silicon oxynitride. In some implementations, the IL 108 can be grown by oxidizing the substrate 102, which typically contains Si, to obtain SiOx. In various embodiments, the IL 108 may be formed by any suitable process such as, chemical vapor deposition (CVD), atomic layer deposition (ALD), low-pressure CVD (PCVD), thermal oxidation, or any other suitable process for forming IL 108 as known in the art. In some implementations, a cleansing process may be performed on the substrate 102, for example, using a mixture of H2SO4 and H2O2 to remove organics on the upper surface of the substrate 102.

In some embodiments, the HK layer 106 can be grown using a thermal oxidation process mentioned above. High-k material in the HK layer 106 may include a material with a dielectric constant "k" higher than 10. Examples of high-k materials used in various embodiments may include tantalum oxide (Ta2O5), strontium titanium oxide (SrTiO3), hafnium oxide (HfO2), hafnium silicon oxide (HfSiO), zirconium oxide (ZrO2) and the like.

After the insulation layer 104 is formed, the fabrication process can proceed to anneal the high-k material in layer 104. FIG. 2 illustrates an example of the enhanced annealing process incorporated in the fabrication process. As shown, after the insulation layer 104 is formed, the insulation layer 104 can be exposed to nitrogen gas 202 through the enhanced annealing process in accordance with the disclosure. The composition of the nitrogen gas 202 can include 75% helium and 25% nitrogen. The plasma nitrogen concentration of gas 202 may vary from 10% to 25%, with helium providing the balance. In some implementations, a source of nitrogen can be introduced into the plasma to form the nitrogen-containing plasma. In those implementations, the source of nitrogen may comprise a material selected from a group consisting of N2, NH3, NO, N2O, and a mixture thereof. The enhanced annealing process in accordance with the disclosure can be performed between 300° C. to 500° C. at a pressure of 15-20 atm for 15 to 50 minutes in some embodiments.

FIG. 3 shows an effect of H+ diffusion due to the relatively high pressure of the annealing process in accordance with the disclosure. As shown, under the relatively high pressure of the annealing process in accordance with the disclosure, e.g., greater than 15 atm as compared to ambient atmosphere at which the conventional annealing process is typically operated, H+302, from gas 202, can quickly diffuse into the interface between HK layer 106 and IL 108 in the insulation layer 104, and as well as the interface between the IL 108 and the substrate 102. This diffusion of H+302 can help repair broken bonds in the IL 108 (e.g., SiO2 and ultra-thin), effectively reduce density of IL 108 and thus improve NBTI. On the other hand, at relatively low temperature, e.g., 300-500° C. as compared to 700-750° C. at which some the conventional annealing process is operated, the enhanced annealing process in accordance with the disclosure may not adversely affect the NiSi grown and/or ions implanted in the layer 104.

In some implementations, the enhanced annealing process in accordance with the disclosure can include two separate steps. In those implementations, the first step may include ammonia annealing the high-k material at relatively low temperature, for example at 300-500c. The second step may include hydrogen (e.g., H2) baking the high-k material at relatively low temperature, for example at 300-500° C. In some implementations, the ammonia annealing can include rapid thermal anneal (RTA) through laser at high pressure, e.g., between 15-20 atm, or a combination of regular RTA and laser RTA. In one embodiment, the enhanced annealing process is operated at 400 C for 30 minutes at a pressure ranging between 15-20 atm.

Embodiments of the present invention provide many advantages over existing techniques and methods, as explained throughout the parts of the application. It is to be appreciated that embodiments of the present invention are compatible with existing systems and processes. For example, the shaped cavities described according to the embodiments of the present invention can be manufactured using existing equipment. The shaped cavities according to embodiments of the present invention can be easily used in manufacturing various types of devices, such as CMOS, PMOS, NMOS, etc.

While the above is a full description of the specific embodiments, various modifications, alternative constructions and equivalents may be used. In addition to what is described above, there are other embodiments as well. Therefore, the above description and illustrations should not be taken as limiting the scope of the present invention which is defined by the appended claims.

What is claimed is:

1. A method for fabricating a semiconductor device, the method comprising:
    forming a substrate comprising silicon material;
    cleansing the upper surface of the substrate using a hydrogen compound;
    forming an insulation layer on the substrate, the insulation layer comprising:
    an interfacial layer formed on an upper surface of the substrate, and
    a high-k dielectric layer formed on the interfacial layer, the high-k dielectric layer comprising hafnium oxide (HfO2); and
    performing an annealing process with a nitrogen gas to the insulation layer after the insulation is formed, wherein the annealing process is performed at a temperature between 300° C. and 500° C., and at a pressure above 15 atm; and, wherein
    the nitrogen gas used in the annealing process comprises ammonia (NH3).

2. The method of claim 1, wherein the annealing process is operated for a time period between 10 to 50 minutes.

3. The method of claim 1, wherein the annealing process is operated at a pressure between 15 to 20 atm.

4. The method of claim 1, wherein the annealing process is operated at a temperature of 400° C. for 30 minutes.

5. The method of claim 1, further comprising baking the insulation layer at a temperature between 300° C. and 500° C.

6. The method of claim 1, wherein the annealing process can including rapid thermal anneal (RTA) through laser.

7. The method of claim 1, wherein the annealing process can include a combination of regular RTA and laser RTA.

8. The method of claim 1, wherein the hydrogen compound includes H2SO4 and H2O2.

* * * * *